(12) United States Patent
de Jong et al.

(10) Patent No.: US 7,638,822 B1
(45) Date of Patent: Dec. 29, 2009

(54) MEMORY CELL WITH SINGLE-EVENT-UPSET TOLERANCE

(75) Inventors: Jan L. de Jong, Cupertino, CA (US); Susan Xuan Nguyen, Fremont, CA (US); Raymond C. Pang, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 563 days.

(21) Appl. No.: 11/649,448

(22) Filed: Jan. 3, 2007

(51) Int. Cl.
*H01L 27/10* (2006.01)
*H01L 27/11* (2006.01)

(52) U.S. Cl. .............. 257/206; 257/208; 257/E27.108; 257/903; 365/154

(58) Field of Classification Search ................ 257/202, 257/203, 204, 206, 208, 903, 27.108 E; 365/154
See application file for complete search history.

(56) References Cited

U.S. PATENT DOCUMENTS

| | | | |
|---|---|---|---|
| 4,782,467 A | 11/1988 | Belt et al. | |
| 5,570,313 A | 10/1996 | Masson et al. | |
| 6,487,134 B2 * | 11/2002 | Thoma et al. | 365/205 |
| 6,570,206 B1 | 5/2003 | Sakata et al. | |
| 6,573,773 B2 | 6/2003 | Maki et al. | |
| 6,627,960 B2 * | 9/2003 | Nii et al. | 257/371 |
| 6,806,525 B2 | 10/2004 | Takeuchi et al. | |
| 7,111,215 B1 | 9/2006 | Keller et al. | |
| 7,139,190 B1 | 11/2006 | de Jong | |
| 7,321,506 B2 * | 1/2008 | Roche et al. | 365/154 |
| 7,332,780 B2 * | 2/2008 | Matsuda et al. | 257/369 |
| 7,535,743 B2 * | 5/2009 | Roche et al. | 365/63 |
| 2006/0056220 A1 | 3/2006 | Roche et al. | |

OTHER PUBLICATIONS

U.S. Appl. No. 11/649,447, filed Jan. 3, 2007, De Jong, Jan L., et al., Xilinx, Inc. 2100 Logic Drive, San Jose, CA 95124.
Velazco, R. et al., "Two CMOS Memory Cells Suitable for the Design of SEU-Tolerant VLSI Circuits", IEEE Transactions on Nuclear Science Dec. 1994, pp. 2229-2234, vol. 41, No. 6, available from IEEE, 3 Park Avenue, 17th Floor, New York, NY 10016-5997.

* cited by examiner

*Primary Examiner*—Shouxiang Hu
(74) *Attorney, Agent, or Firm*—Scott Hewett (57) ABSTRACT

A memory cell having a plurality of transistors connected so as to restore a data value to a node of the memory cell to an initial value following an event upsetting the initial value has an aspect ratio of at least 5:1. The high aspect ratio provides adequate spacing between nodes of the memory cell for SEU tolerance at small design technologies.

20 Claims, 7 Drawing Sheets

MEMORY CELL WITH SINGLE-EVENT-UPSET TOLERANCE

FIELD OF THE INVENTION

This invention relates generally to complementary metal-oxide-semiconductor ("CMOS") memory cells, and more particularly to memory cells tolerant to high energy particle ("ion") hits.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

PLDs and other ICs that are specialized to be radiation tolerant are desirable for certain applications. Such ICs are often referred to as single event upset (SEU) tolerant ICs, heavy ion tolerant (HIT) ICs or radiation-hardened ICs. An SEU arises when a heavy ion or high-energy particle, such as an alpha particle or neutron, hits a memory cell, charging internal nodes of the memory cell that can change the memory state. For convenience of discussion, an SEU will be referred to as an "ion hit," whether it involves an ion or other high-energy particle causing the error.

Two basic approaches to improve SEU tolerance have been tried. One approach is commonly called "resistive hardening;" however, resistive hardening can significantly degrade latch performance. Another disadvantage arises if a standard CMOS fabrication has to be modified to accommodate a resistively hardened IC. It is highly desirable that SEU tolerant ICs be made using standard CMOS fabrication processes.

Another approach to improve SEU tolerance is commonly called "design hardening." Design hardening generally refers to laying out a memory cell or other circuit to improve recovery of data after ion hits. A general discussion of design hardening is found in the paper entitled Two CMOS Memory Cells Suitable for the Design of SEU-Tolerant VLSI Circuits, by Velazco et al., IEEE Transactions on Nuclear Science, Vol. 41, No. 6 (December 1994), the disclosure of which is hereby incorporated by reference in its entirety for all purposes.

In design hardening, redundant storage bits are located apart from each other, maintaining a source of initial data after an SEU upsets one of the storage bits. Many variations are known, using sixteen-, fourteen- and twelve-transistor SEU tolerant memory cells.

Figure 1:
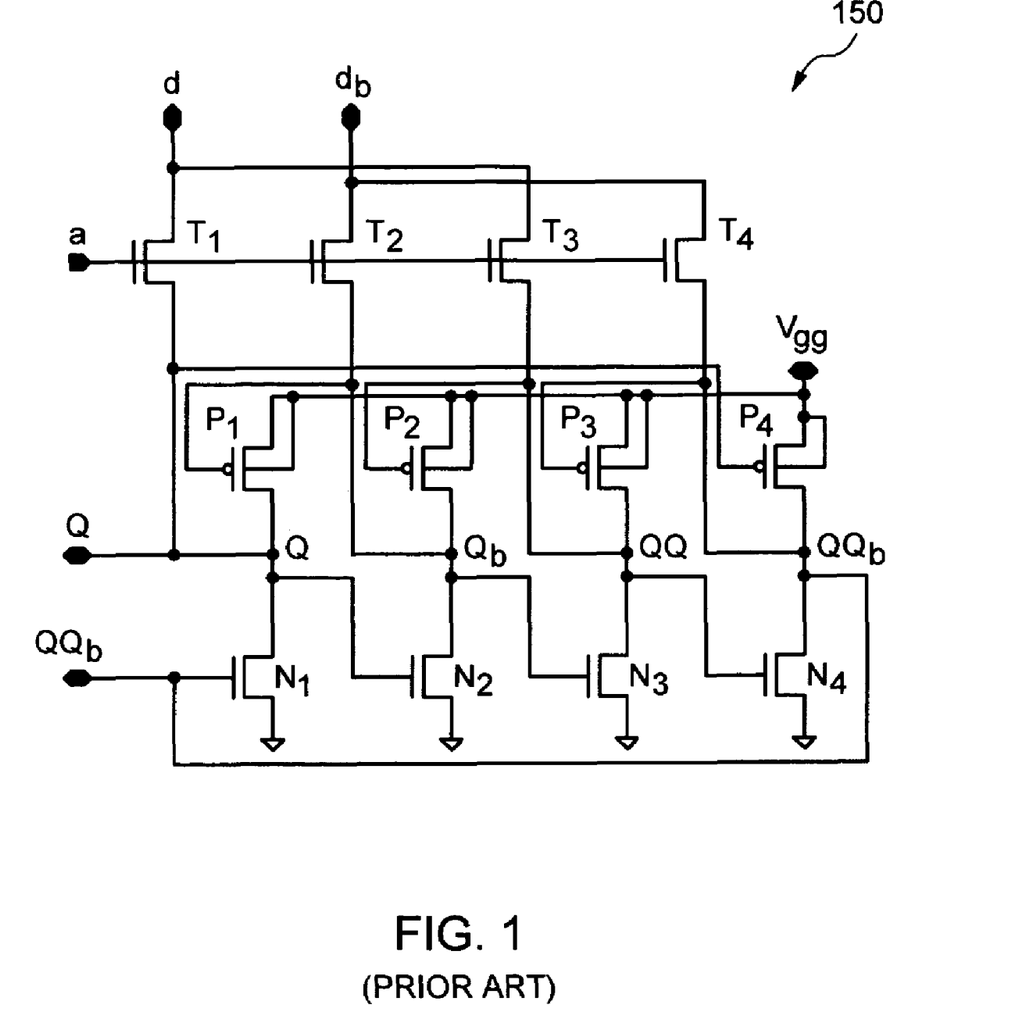
FIG. 1 is a circuit diagram of a prior art twelve-transistor SEU tolerant memory cell.

FIG. 1 is a circuit diagram of a prior art twelve-transistor SEU tolerant memory cell 150. As used herein, "twelve-transistor memory cell" refers to both the storage devices N1, N2, N3, N4, P1, P2, P3, P4 and the access devices T1, T2, T3, T4. Those of skill in the art of SEU resistant memory cells appreciate that the number of access devices is not always included in the transistor count or shown in the memory cell circuit diagram. The operation of the memory cell 150 will be familiar to those of skill in the art. A detailed description of a similar SEU resistant memory cell is described in U.S. Pat. No. 5,570,313 by Masson et al. and in U.S. Patent Application No. 2006/0056220 A1 by Roche et al., the disclosures of which are incorporated herein by reference in their entirety for all purposes. A detailed description of the electrical operation of the circuit is therefore omitted.

The memory cell circuit 150 has data terminals d, $d_b$ ("data BAR"), output terminals Q, $QQ_b$, and internal nodes 152, 154 that store values $Q_b$ and QQ, respectively. A data value is a digital zero or digital one value, and the bar value is the opposite value. For example, if Q=1, then $Q_b$=0. QQ saves a redundant value of Q, and $QQ_b$ saves a redundant value of $Q_b$. The values stored at the nodes are utilized in restoring the state of the memory cell if a node is upset by an SEU.

Since QQ has the same value of Q, and $QQ_b$ has the same value of $Q_b$, other nodes could be used for the outputs of the memory cell 150. For example, instead of Q and $QQ_b$ being the nodes that are output, as shown in FIG. 1, the outputs could be nodes QQ and $QQ_b$, nodes Q and $Q_b$, or nodes QQ and $Q_b$. Furthermore, in a memory array having several similar memory cells defined in the silicon layer, some memory cells in the array may interface to other portions (circuits) of an IC through nodes Q and $Q_b$, and other memory cells may interface to other portions or the IC through nodes QQ and $Q_b$, for example.

Redundant data storage nodes are used for storing information. If data stored in one node is changed by an ion hit, the redundant node restores the other node to its initial value (state). This protects the data stored in the memory cell from ion hits as long as the data values stored in both of the redundant nodes are not simultaneously changed by an ion hit. It is desirable to physically separate redundant nodes to avoid both nodes from being affected by a single ion hit.

An ion hit creates charge in the silicon of the memory cell. This charge can upset the data value stored at a node by changing the voltage at that node. As the devices used in memory cells shrink, the amount of charge required to upset a stored data value also decreases. Charge is generated about a radius of the path of the ion. Although this charge radius depends on the energy of the ion, it is generally desirable to separate redundant nodes in SEU tolerant memory cells by at least one micron.

As the design technology decreases for IC production, a memory cell layout appropriate for a larger technology design dimension (e.g., 90 nm technology) might not provide adequate SEU tolerance when reduced to a smaller design dimension (e.g., 65 nm technology) product. For example, an SEU tolerant cell layout that provides sufficient spacing between redundant nodes in a 90 nm design might provide insufficient spacing when reduced to a 65 nm design.

Therefore, memory cells suitable for small geometry (small design technology) ICs that provide SEU tolerance is desirable.

SUMMARY OF THE INVENTION

A memory cell having a plurality of transistors connected so as to restore a data value to a node of the memory cell to an initial value following an event upsetting the initial value has an aspect ratio of at least 5:1. The high aspect ratio provides adequate spacing between nodes of the memory cell for SEU tolerance at small design technologies.

In a particular embodiment, the memory cell has a first well of a first type having a first node target area and a second node target area. The memory cell also has a second well of the first type having a third node target area and a fourth node target area. A first well of a second type is between a third well of the first type and the first well of the first type. A second well of the second type is between the second well of the first type and the third well of the first type.

DETAILED DESCRIPTION

Figure 2:
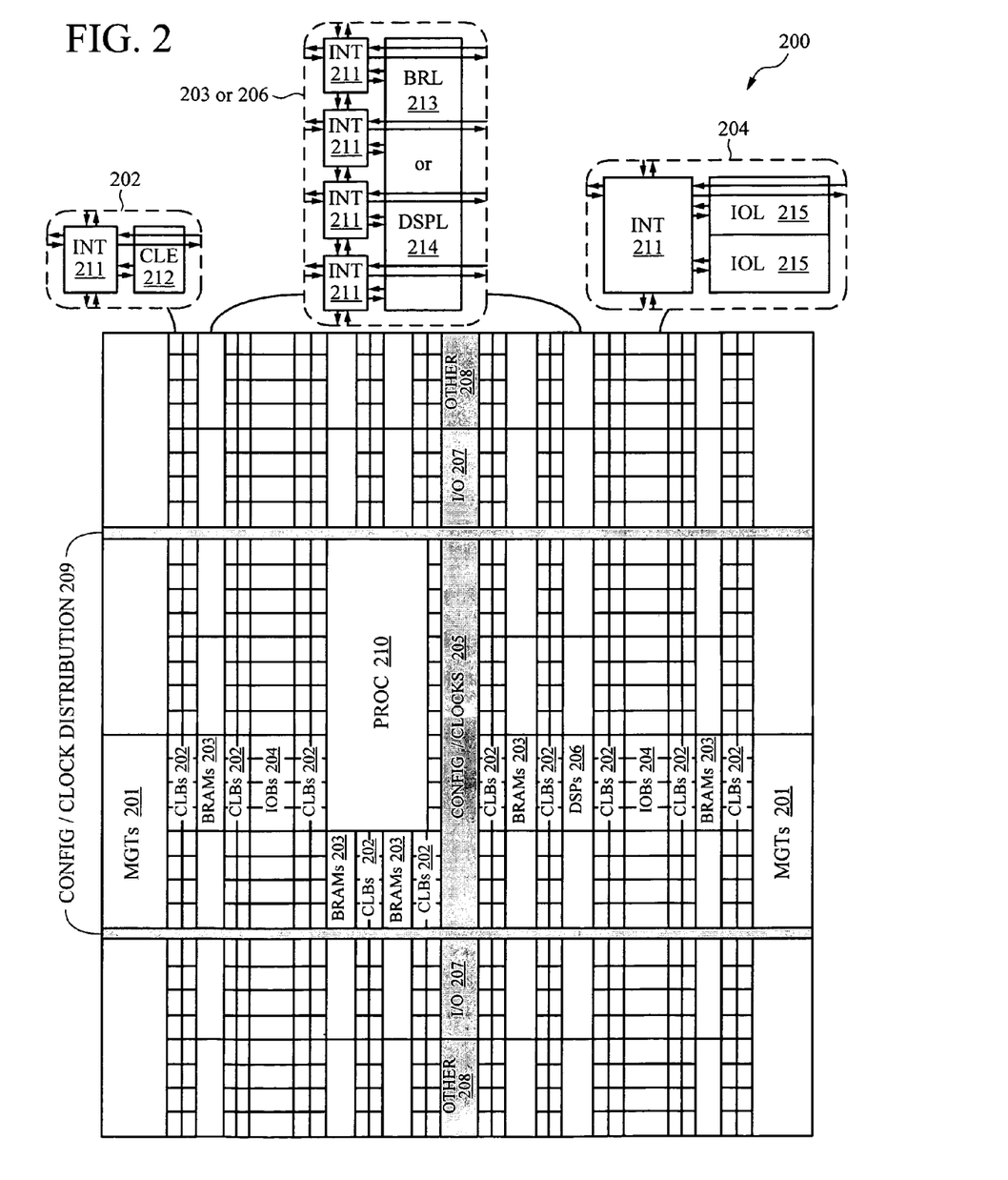
FIG. 2 is a plan view of an FPGA architecture suitable for implementing embodiments of the invention.

FIG. 2 illustrates an FPGA architecture 200 suitable for implementing embodiments of the invention. The FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Embodiments of the invention are incorporated in any of several portions of the FPGA 200. For example, SEU-tolerant memory cells and memory arrays are incorporated in BRAMs or configuration memory. Configuration memory is distributed throughout an FPGA and is generally present in numerous types of programmable blocks, such as CLBs and IOs. Some types of memory, such as block memory, use error code correction techniques, and are less susceptible to SEU errors. Non-correcting, six-transistor memory cells are suitable for many applications in an FPGA.

The configuration memory cells in an FPGA are used to control the operation of other circuits. Within the FPGA, the memory cells are placed in columns, where there could be groups of 1, 2, or 3 columns separated by circuits controlled by the memory cells. Memory cell outputs can connect to the circuits using poly or metal layers.

Configuration memory is particularly susceptible to SEU because error code correction techniques cannot be used, and an error in configuration memory can change the functionality of a block in the FPGA. In a particular embodiment, the FPGA 200 is fabricated using a technology design less than 90 nm. It is particularly challenging to provide SEU tolerant memory for small technology designs because as the design technology decreases, the separation between nodes of a memory cell decreases. The amount of charge needed to upset a data value stored at a node also typically decreases. Memory cell layouts with high aspect ratios have sufficient separation between redundant nodes to provide high SEU tolerance, even in small technology designs.

Figure 3A:
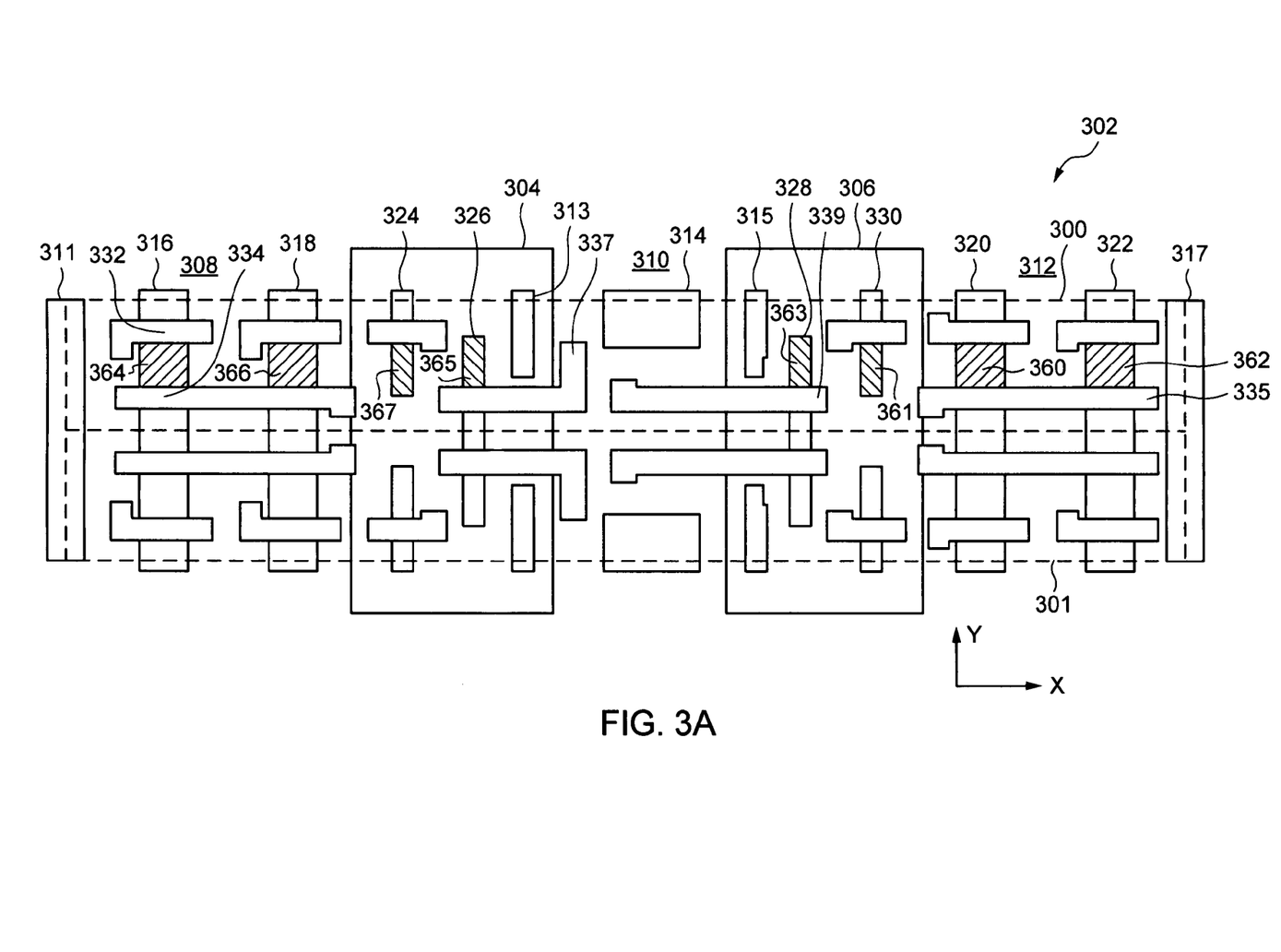
FIG. 3A is a layout of an SEU tolerant memory cell according to an embodiment of the invention.

FIG. 3A is a layout of an SEU-tolerant memory cell 300 according to an embodiment of the invention. The memory cell 300 is within the dashed rectangle. Another memory cell 301 that is essentially a mirror image of the memory cell 300 is below memory cell 300. The first and second memory cells 300, 301 form a portion of a memory cell array 302 in an IC, such as in an FPGA. In a particular embodiment, the memory cells 300, 301 are stepped in a repeated fashion to form a memory array having thousands of memory cells, each memory cell having an aspect ratio of at least 5:1.

As used herein, the "aspect ratio" of a memory cell is the ratio of a long dimension (e.g., the X dimension of memory cell 300) to a short dimension (e.g., the y dimension of memory cell 300) of a rectangular area that is generally repeated for several memory cells in a memory array. For example, the dashed line indicating memory cell 300 defines the same area and has the same aspect ratio as the dashed line indicating memory cell 301. Similar areas for additional memory cells (not shown) may be defined (laid out) above, below, and to either side of the memory cells 300, 301, as is known in the art.

For purposes of convenient discussion and illustration, a P-type semiconductor substrate, which may optionally have a P-type epitaxial layer, having N-wells formed in it will be used in a particular example. Alternative embodiments use N-type substrates with P-wells formed in the substrate. The memory cell 300 has an aspect ratio greater than 5:1 (X:Y). This allows redundant nodes to be physically separated so that a single ion hit is highly unlikely to alter the data value stored on both nodes, thus allowing recovery of the initial stored value when one of the nodes is upset by an ion hit.

The memory cell 300 has a first N-well 304 and a second N-well 306, which in a particular embodiment are formed by an ion implantation technique. Ion implantation and other doping techniques are well known in the art of CMOS fabrication, as is forming doped well structures, and a detailed description is therefore omitted. The memory cell 300 also has three P-type regions 308, 310, 312, that will be referred to as "P-wells", as is commonly done in the art (see, e.g., U.S. Patent Application Publication No. 2006/0056220 A1, ¶¶s [0053]-[0055], the disclosure of which is incorporated by reference hereby in its entirety for all purposes). Thus FIG. 3A shows the memory cell 300 having, from left to right, a first P-well 308, a first N-well 304, a second P-well 310, a second N-well 306, and a third P-well 312. The terms "left", "right", "first", "second", and "third" are arbitrarily chosen for purposes of convenient discussion, and are not limiting. As used herein, the term "well" includes not only conventional wells formed in a silicon wafer or similar substrate, but also well-like structures formed on silicon-on-insulator ("SOI") substrates, for example.

The memory cell 300 includes N-diffusions 316, 318, 320, 322 and P-diffusions 324, 326, 328, 330 for the p-type and n-type transistors used in the memory cell. Gate structures, such as gate structure 332, are polylsilicon, silicide, or other material, and form a channel region in the diffusion 316, as is well known in the art. Since gate structures are very well known to those of ordinary skill in the art, not all gate structures are identified with a reference numeral in order to simplify and clarify the illustration. Similarly, contacts are not shown to improve the clarity of illustration, as contacts to gate structures, taps, wells, and other features are well known, and a variety of contact placements is possible. It is commonly understood that an FET generally may have a gate contact, a source contact, and a drain contact (e.g., gate structure 332 would have a contact, and the associated diffusion 316 would have contacts ("source/drain" contacts also known as "diffusion contacts", see FIG. 5B, on either side of the gate structure 332). Whether a source/drain contact operates as a source or as a drain depends on the electrical connections made to the physical device. Calling such contacts "source/drain contacts" is well understood in the art. A contact may not always be necessary, for instance in cases where the gate, source, or drain region does not need to be connected to other parts of the circuit, or where they are connected, for example, by diffusion or poly routing.

N-diffusion 316 is crossed by a first gate structure 332 and a second gate structure 334, which allows the formation of two FETs using a common diffusion. (see FIG. 3B, N3, T3) Note also that the second gate structure 334 also crosses N-diffusion 318. Thus, the gate structure 334 is used for two FETs (see FIG. 3B, T3, T4) and extends along the X direction, utilizing the high aspect ratio of the memory cell 300.

Using a common diffusion for multiple FETs reduces the physical size (area) of the memory cell and provides a twelve-transistor SEU tolerant memory cell having a short height (y-direction as viewed in FIG. 3A). The high aspect ratio of the memory cell layout provides a small cell area with separation between redundant nodes for high SEU tolerance.

The memory cell 300 also has N-tap diffusions ("N-taps") 313, 315, and the P-tap diffusions ("P-taps") 311, 314, 317. Gate structures 334, 335 form access transistors (see FIG. 3B, T3, T4) and gate structure 339 forms a PMOS transistor (see FIG. 3B, P2), for example. The high aspect ratio of the memory cell layout allows the gate structures 337, 339 to be extended to facilitate connections between half cells (see FIGS. 5A-5E, illustrating patterned metal layers electrically connecting the memory cell devices). For example, the "L" shape of gate structure 337 moves the contact position above gate structure 339 so that contacts and metal traces above the gate structures 337, 339 do not interfere.

The memory cell 300 has P-taps 311, 314, 317 on both sides of each N-well 304, 306. The taps provide current paths for charge generated by ion hits, and are biased to form a P-N junction between the N-wells 304, 306 and the substrate/P-wells 308, 310, 312. In a particular embodiment, the P-taps are grounded, and the N-taps are biased to a supply voltage level (Vgg). An ion generates charge as it travels through the semiconductor material. An ion hitting an N-well would generate charge in the N-well material, as well as possibly in the semiconductor material (substrate) below the N-well.

However, the P-N junction between the N-well and the underlying P-type substrate inhibits ion-generated charge flow from the substrate into the N-well. In the P-wells 308, 310, 312, the charge generated by an ion hit is not blocked, thus the NMOS devices in the P-wells are more susceptible to being upset from an ion hit than are the PMOS devices in the N-wells, and it is desirable to separate the NMOS devices farther apart to provide SEU tolerance. In an embodiment having P-wells formed in an N-type substrate, it would be desirable to provide farther separation between the PMOS devices than the NMOS devices for similar reasons.

The P-tap 314 to the center P-well 310 provides a current path for ion-generated charge in the P-well 310/substrate. Splitting the N-wells 304, 306 and including the P-tap 314 between them reduces the length charge, including charge generated in the substrate below the N-wells 304, 306, has to flow through the P-type semiconductor material before it is removed at a tap, compared to an embodiment having a single N-well (see FIG. 4). Separating the N-wells 304, 306 with an intervening P-well 310 also essentially eliminates the effect charge generated in one N-well (e.g., 304) has on the other N-well (e.g., 306), further enhancing SEU tolerance.

In a particular embodiment, the memory cells 300, 301 are repeated in a columnar fashion to form a memory cell array. For example, the 2-cell layout is stepped sixteen times to form an array of thirty-two twelve-transistor memory cells; however, such an array is merely exemplary. In such a memory cell array, features of one memory cell (e.g., the P-tap 314) may be shared with an adjacent memory cell, and some features (e.g., diffusions 316, 318, 320, 322) are shared with several memory cells, which may result in a more compact layout and a reduced total area occupied by the array.

The memory cell 300 is laid out along the long axis (X direction) of the aspect ratio. Unlike lower aspect ratio memory cells where several gate structures are stacked on top of each other, the gate structures of memory cell 300 are spread along the X-axis. The high aspect ratio memory cell provides multiple diffusions 316, 318 in P-well 308 for four NMOS devices (two with each diffusion), whereas a conventional, low aspect ratio SEU memory cell uses a single diffusion for all four NMOS devices.

Figure 3B:
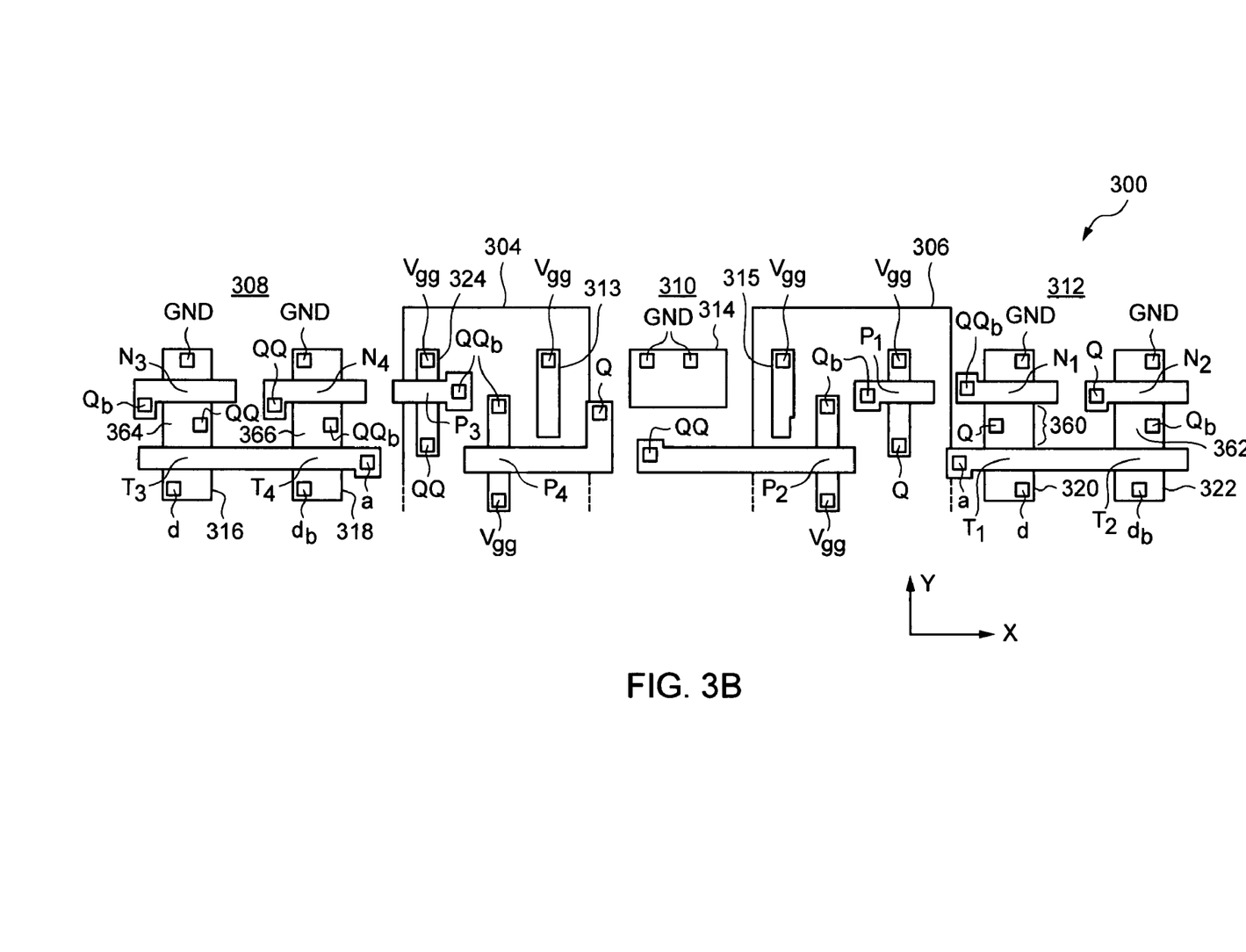
FIG. 3B shows the memory cell of FIG. 3A with indicators corresponding to the circuit diagram of FIG. 1.

Using multiple diffusions 316, 318 in the P-well 308 also reduces the node target areas 364, 366, indicated by hatching on the diffusions 316, 318. Referring to FIG. 3B, the node target areas are the portions of the diffusion areas connected to a node (e.g., Q, $Q_b$, QQ, or $QQ_b$), and are the portions of the diffusion areas most susceptible to an ion hit upsetting a data value at the node. Node target areas 360, 362 in the P-well 312 and node target areas 361, 263, 365, and 367 in N-wells 306 and 304, respectively, are also shown. It is particularly desirable to keep redundant node target areas physically separated and electrically isolated to provide SEU tolerance.

FIG. 3B shows a layout of the memory cell 300 of FIG. 3A with notation corresponding to the circuit diagram 150 of FIG. 1. There are various ways to electrically connect the transistors of the memory cell 300 of FIG. 3A, and the circuit indicated in FIG. 3B is merely exemplary for purposes of discussion. The memory cell 300 has a plurality of transistors connected so as to restore a data value to a node of the memory cell to an initial value following an event upsetting the initial value, the plurality of transistors including at least a first storage transistor of a first type (e.g., N3) in a first diffusion (e.g., 316) in a first well of a first type (e.g., 308), a second storage transistor of the first type (e.g., N4) in a second diffusion (e.g., 318) in the first well of the first type, a third storage transistor of the first type (e.g., N1) in a third diffusion (e.g., 320) in a second well of the first type (e.g., 312), a fourth storage transistor of the first type (e.g., N2) in a fourth diffusion (e.g., 322) in the second well of the first type; and first, second, third, and fourth transistors of a second type (P1, P2, P3, P4) formed in at least a first well of a second type (304, 306), the first well of the second type being disposed between the first well of the first type and the second well of the first type along the long dimension (X) of the memory cell.

Referring to the description of FIG. 1 describing operation of an SEU resistant memory cell circuit, storage transistors N1 and N2 in FIG. 3B are in P-well 31.2, while storage transistors N3 and N4 are in P-well 308. Two N-wells 304, 306, and a P-well 310 are between storage transistors N1, N2 and storage transistors N3, N4. The N-wells 304, 306 include taps 313, 315, and the center P-well 310 includes tap 314. The taps for P-wells 308 and 312 are not shown in this view (see FIG. 3A, ref. nums. 311, 317). It is desirable to physically separate these transistors to provide SEU resistance against a single ion hitting both source/drain diffusion areas 316 and 322 or both source/drain diffusion areas 318 and 320 so that a spurious event, such as a ion hit to the memory cell 300, does not simultaneously affect the values at the node pairs Q-QQ or $Q_b$-$QQ_b$. In a particular embodiment of a memory cell designed according to a 65 nm design technology, the separation between associated source/drain diffusion areas (e.g., area 318 from area 320) of NMOS storage FETs (e.g., N1 and N4) is at least two microns.

Similarly, PMOS storage device P3 is separated from P2 by at least one micron, and P4 is separated from P1 by at least one micron. Separating the source/drain diffusion areas of P-type storage devices associated with logic value restoration is desirable to avoid a single ion hitting, and thus upsetting, P1 and P4 or P2 and P3 simultaneously. It is desirable to provide greater separation between N-type storage FETs (e.g., N1 and N4) in a P-type substrate because charge generated in the substrate has a free path back to the P-wells 308, 312, whereas the N-wells 304, 306 are isolated from the substrate by appropriate bias voltages forming a junction between the N-well and substrate.

In FIG. 3B, contacts are shown as small squares, and electrical connections to the contacts are indicated according to the labeling of the circuit diagram of FIG. 1. In diffusion area 320 in P-well 312, the portion of the diffusion area 360 between N1 and T1 is connected to Q. It is desirable to minimize this portion ("node target area") 360 of the diffusion 320 to minimize the target area presented to an ion, as an ion hit in 360 could create charge that upsets the data value stored at node Q.

The high aspect ratio layout of memory cell 300 provides small node target areas 360, 362, 364, 366 for nodes Q, $QQ_b$, $Q_b$ and QQ in the diffusions 320, 322, 318, 316 (see FIG. 3A, ref. nums. 361, 363, 365, 367 for node target areas associated with the PMOS devices). The gate structures (see, e.g., FIG. 3A, ref. num. 335) are laid out so that their long dimension is essentially parallel to the long dimension of the high aspect ratio memory cell 300 (i.e., along the X direction), which facilitates small node target areas, but which is not essential in all embodiments.

The high aspect ratio of the memory cell provides high SEU tolerance by separating the critical areas of the memory cell 300, while providing a low memory cell area and the opportunity to share diffusion areas between vertically adjacent memory cells (e.g., 300, 301) in a memory array. An aspect ratio of at least 5:1 is desirable to maintain at least one micron between PMOS storage devices and at least two microns between NMOS storage devices in a P-type substrate, and at least one micron between NMOS storage devices and at least two microns between PMOS devices in an N-type substrate. An aspect ratio of at least 5:1 allows multiple diffusions (e.g., 326 and 318) in the wells with sufficient height to provide wiring paths between half cells (i.e., between the six transistors on the left side of the memory cell and the six transistors on the right side), which provides improved physical separation of critical areas of the memory cell for improved SEU tolerance. The aspect ratio of an SEU memory cell generally increases with smaller design technologies, which maintains adequate separation between redundant node target areas while reducing the area of the memory cell. In a memory cell having a lower aspect ratio (e.g., 1.2:1), shrinking the cell layout to a smaller design geometry can result in redundant node target areas being undesirably close.

In a particular embodiment, a memory cell substantially in accordance with FIG. 3A using 65 nm design technology has an aspect ratio of about 9:1. The width of the memory cell is about 6.45 microns, which is essentially the same as the cell width (6.50 microns) of a twelve-transistor memory cell designed according to 90 nm technology. The height of the memory cell is about 0.7 microns which is about one-half the height (1.32 microns) of a twelve-transistor SEU tolerant memory cell with 90 nm technology. The layout of the 9:1, 65 nm technology memory cell provides a twelve-transistor SEU tolerant memory cell that maintains about two microns of separation between redundant PMOS storage devices, and at least about four microns of separation between NMOS storage devices while consuming only 52.7% of the area of a 90 nm design technology memory cell.

Figure 4:
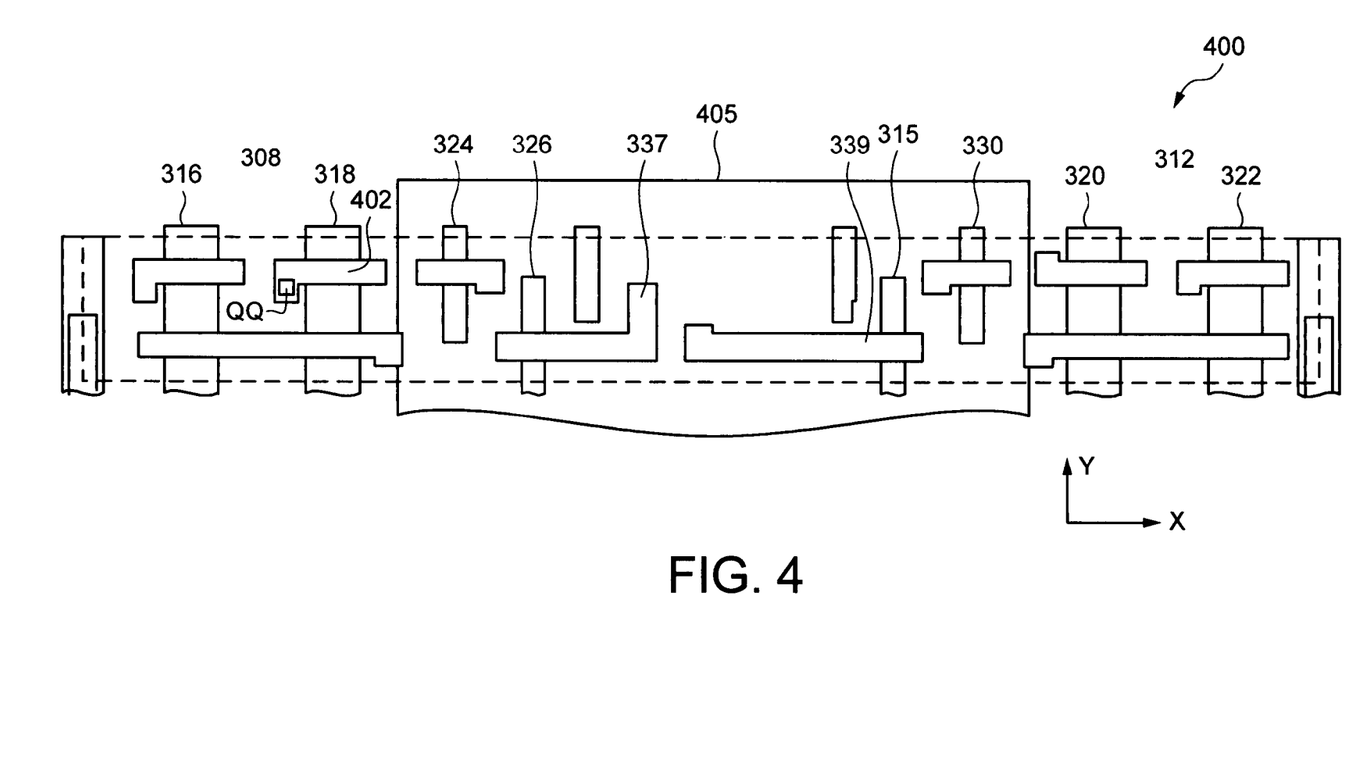
FIG. 4 is a layout of an SEU tolerant memory cell according to another embodiment of the invention.

FIG. 4 is a layout of an SEU tolerant memory cell 400 according to another embodiment of the invention. Memory cell 400 has a first P-well 308, a second P-well 312, and an N-well 405 formed in a P-type substrate. An alternative embodiment fabricated on an N-type substrate has two N-wells and an intervening P-well. Other features of the memory cell 400 are substantially similar to the features described above in reference to FIGS. 3A and 3B. FIG. 4 shows diffusions 316, 318 in P-well 308, diffusions 324, 326, 315, 330 in N-well 405, and diffusions 320, 322 in P-well 312.

The memory cell 400 has an aspect ratio of at least 5:1. Very generally, referring to diffusion 316 and further in reference to FIG. 3B, there are five vertically spaced features: a lower contact, a first gate structure, a middle contact, a second gate structure, and an upper contact. The vertical spacing between each of these features is determined by layout rules governing a design technology. In other words, the spacing will be greater in a 90 nm technology than in a 65 nm technology. Similar layout rules are applied to the lateral features (e.g., diffusions 316, 318, and the intervening area providing a contact QQ to gate structure 402).

Memory cell 400 omits the center P-well 310 of the memory cell 300 shown in FIG. 3A. In a 65 nm design technology, the aspect ratio of memory cell 400 is less than 9:1. In a particular embodiment, a memory cell in accordance with FIG. 4 has an aspect ratio of about 7.8:1. In an alternative embodiment, a center N-well has less than four diffusions and a memory cell according to a 65 nm design technology has an aspect ratio of about 5.4:1.

FIGS. 5A-5E show various layers of a memory cell according to an embodiment of the invention. Generally, memory cells are repeated in a memory array (see FIG. 3A, ref. nums. 300, 301). It is highly desirable to provide the electrical connections between terminals in each memory cell within the "footprint" (area) of the memory cell to allow stepping and repeating memory cells and their associated wiring in a memory array of an IC.

It is desirable to have an SEU tolerant memory cell layout that can be easily substituted for conventional six-transistor memory cell arrays in an FPGA to provide an SEU tolerant FPGA. In an embodiment of the invention, the layout of the SEU tolerant memory cell has an interface where Q or QQ, and $Q_b$ or $QQ_b$ (i.e., the redundant values) at each of the left and right sides of a high aspect ratio SEU tolerant memory cell. Q and QQ are logically identical, so it is sufficient to have one or the other node value at a cell edge. Providing both Q and QQ to both the left and right sides of the memory cell is not required (and similarly for $Q_b$ and $QQ_b$).

In FIGS. 5A-5E, it will be noted that Q/QQ and Qb/$QQ_b$ values are present in many conductive (i.e., poly and metal) layers, which provides flexibility in electrically connecting the memory cell to other circuits in an IC, as well as in connecting elements of the memory cell together. Additionally, in a particular embodiment, high aspect ratio SEU tolerant memory cells are mirrored about a vertical axis in a memory array. Having each data (node) value present (as either Q or QQ, for example) at both the left and right ends of the memory cell allows flexibility in the wiring connections, since the outputs of both the left column of memory cells (relative to the vertical axis) and the right column of memory cells can be brought to the vertical axis.

High-aspect ratio memory cells are difficult to electrically connect ("wire") in a single metal layer, particularly in ICs using design technology less than 90 nm, because there is not sufficient height to run all the connecting traces back and forth between spaced-apart redundant storage devices and associated access devices. The memory cell of FIG. 3A includes design features for facilitating electrical connections. The central P-well 310 performs an electrical function in cooperation with N-wells 304, 306 to bias the N-wells with respect to the substrate and to provide a short current path for ion-generated charge, as discussed above.

Wiring between electrical terminals of a memory cell having an aspect ratio of about 9:1 is shown in the following sequence of plan views. Wiring memory cells and multimetal layer patterning, vias, contacts, and circuit connection is well known in the art of IC fabrication, thus an abbreviated description is provided. Although the layout of the memory cell illustrated in FIGS. 5A-5E is not identical similar to the memory cell shown in FIG. 3A (e.g., the P-well taps 311, 317 at the end of the memory cell 300 are not shown in FIG. 5A and diffusions 326, 328 are not shown as being shared with a second memory cell 301), it is sufficiently similar that reference to FIGS. 3A and 3B is helpful in understanding wiring of the memory cell in the metal layers.

Figure 5A:
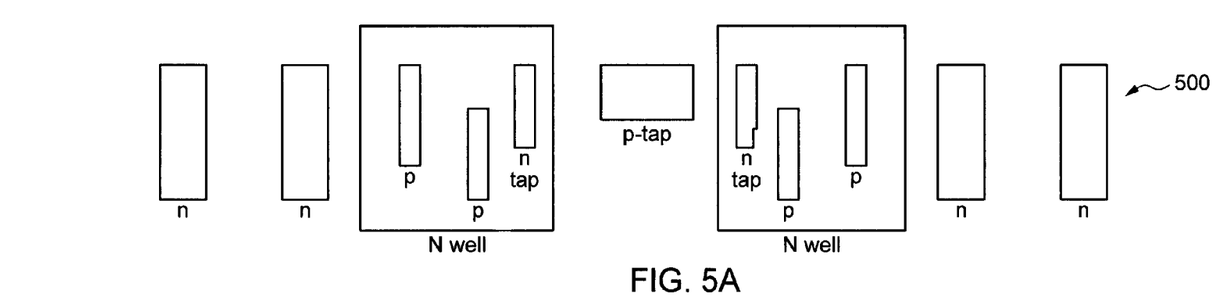
FIGS. 5A-5E show various layers of a memory cell according to an embodiment of the invention.
Figure 5B:
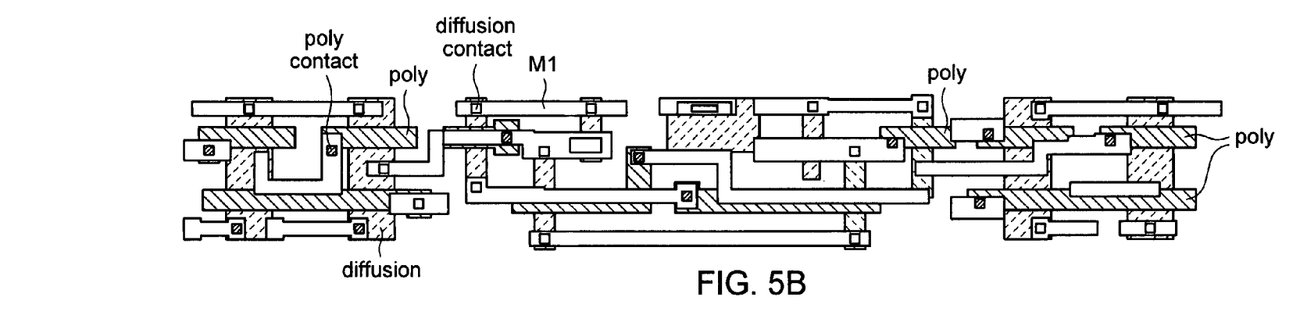

FIG. 5A is a plan view of a memory cell 500 showing N-wells, N-type diffusions ("n"), P-type diffusions ("p"), P-tap ("p-tap"), and N-taps ("n-tap"). FIG. 5B is a plan view of the memory cell of FIG. 5A showing gate structures ("poly") over the diffusion areas and a first patterned metal layer, commonly called the first metal layer ("M1"). The gate structures are not limited to polysilicon or polysilicide. M1-to-poly contacts ("poly contact") are shown as dark rectangles, and M1-to-diffusion contacts ("diffusion contact") are shown as clear rectangles. Some parts of the M1 layer are not connected to the underlying substrate (FIG. 5A), and will be used to route electrical paths from overlying patterned metal layers, as is well understood in the art. Not all features and structures are separately labeled for clarity of illustration, as such features are familiar to those of skill in the art. A layer of dielectric material (not shown), such as a layer of deposited SiO$_2$, is between the M1 layer and the substrate, and the contacts are formed through the dielectric material to electrically connect the M1 layer to the structures of the substrate.

Figure 5C:
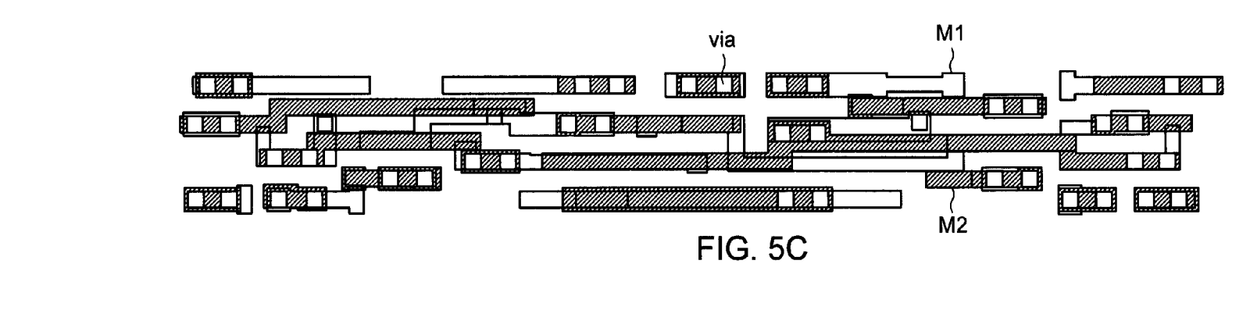
Figure 5D:
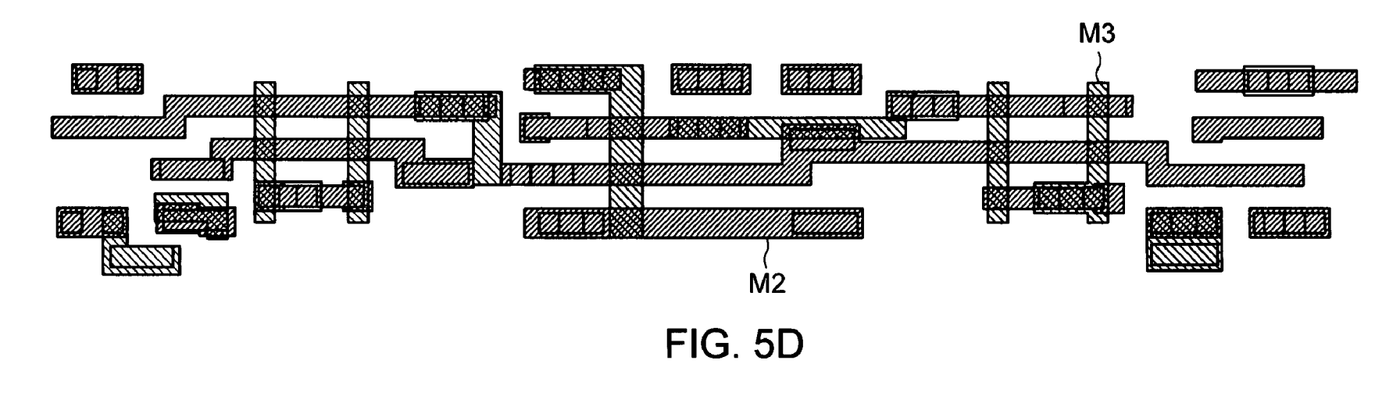
Figure 5E:
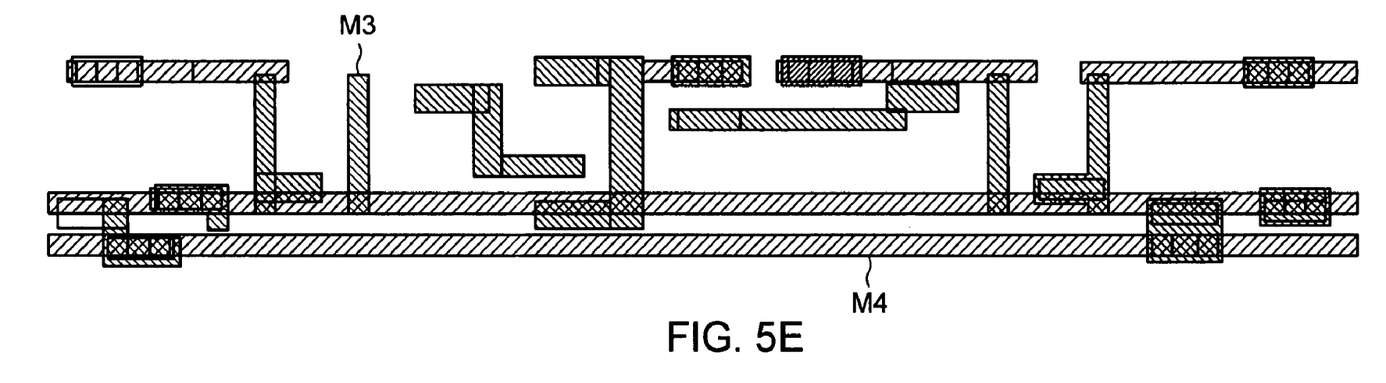

FIG. 5C shows a second patterned metal layer ("M2") over the M1 layer. A second dielectric layer (not shown) is formed between the M1 and M2 layers, and vias are formed through the second dielectric layer to electrically connect selected portions of the patterned M1 layer with selected portions of the patterned M2 layer. FIG. 5D shows a third patterned metal layer ("M3") over the M2 layer. A third dielectric layer (not shown) is formed between the M2 and M3 layers, and vias through the third dielectric layer electrically connect the patterned metal layers in the desired circuit configuration. FIG. 5E shows a fourth patterned metal layer ("M4") over the M3 layer. A fourth dielectric layer (not shown) is formed between the M3 and M4 layers, and vias through the fourth dielectric layer electrically connect the patterned metal layers in the desired circuit configuration.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A memory cell comprising:
   a long dimension;
   a short dimension, an aspect ratio of the long dimension to the short dimension being at least 5:1;
   a plurality of transistors connected so as to restore a data value to a node of the memory cell to an initial value following an event upsetting the initial value, the plurality of transistors including at least
   a first storage transistor of a first type in a first diffusion in a first well of a first type;
   a second storage transistor of the first type in a second diffusion in the first well of the first type;
   a third storage transistor of the first type in a third diffusion in a second well of the first type;
   a fourth storage transistor of the first type in a fourth diffusion in the second well of the first type; and
   first, second, third, and fourth transistors of a second type formed in at least a first well of a second type, the first well of the second type being disposed between the first well of the first type and the second well of the first type along the long dimension of the memory cell.

2. The memory cell of claim 1 wherein the first well of the first type is a first P-well, the second well of the first type is a second P-well, and the first well of the second type is a first N-well.

3. The memory cell of claim 1 wherein the first storage transistor of the first type is an NMOS transistor and the first transistor of the second type is a PMOS transistor.

4. The memory cell of claim 1 wherein the second diffusion is disposed between the first diffusion and the first well of the second type along the long dimension of the memory cell.

5. The memory cell of claim 1 further comprising
   a first node target area in the first diffusion in the first well of the first type;
   a second node target area in the second diffusion in the first well of the first type;
   a third node target area in the third diffusion in the second well of the first type; and
   a fourth node target area in the fourth diffusion in the second well of the first type, wherein a first node of the first node target area is electrically connected to a fourth node of the fourth node target area so as to restore a data value to the first node after an event upsets the data value at the first node, the first node target area being separated from the fourth node target area by at least two microns, and the second node target area being separated from the third node target area by at least two microns.

6. The memory cell of claim 5 wherein the memory cell is fabricated according to a design technology less than 90 nm.

7. The memory cell of claim 1 further comprising
   a second well of the second type; and
   a third well of the first type disposed between the first well of the second type and the second well of the second type.

8. The memory cell of claim 7 wherein the first transistor of the second type and the second transistor of the second type are in the first well of the second type and the third transistor of the second type and the fourth transistor of the second type are in the second well of the second type, and wherein the first transistor of the second type is separated from the third transistor of the second type by at least one micron.

9. The memory cell of claim 8 further wherein the first transistor of the second type is in a fifth diffusion in the first well of the second type, the second transistor of the second type is in a sixth diffusion in the first well of the second type, the third transistor of the second type is in a seventh diffusion in the second well of the second type, and the fourth transistor of the second type is in an eighth diffusion in the second well of the second type.

10. The memory cell of claim 8 wherein the first transistor of the second type has a first gate structure extending into the third well of the first type and the third transistor of the second type has a second gate structure extending into the third well of the first type.

11. The memory cell of claim 7 further comprising a first tap to the third well of the first type, a second tap to the first well of the second type, and a third tap to the second well of the second type.

12. The memory cell of claim 7 further comprising
   a first tap to the first well of the first type;
   a second tap to the second well of the first type;
   a third tap to the third well of the first type;
   a fourth tap to the first well of the second type; and
   a fifth tap to the second well of the second type, the first tap, second tap, and third tap being biased to a first voltage level and the forth tap and fifth tap being biased to a second voltage level.

13. The memory cell of claim 7 wherein the first transistor of the second type has a first gate structure extending into the third well of the first type and the third transistor of the second type has a second gate structure extending into the third well of the first type.

14. The memory cell of claim 1 wherein the memory cell is a twelve-transistor memory cell and
   the first well of the first type includes a first access transistor in the first diffusion and a second access transistor in the second diffusion; and
   the second well of the first type includes a third access transistor in the third diffusion and a fourth access transistor in the fourth diffusion.

15. The memory cell of claim 1 wherein the memory cell is a configuration memory cell in a field programmable gate array.

16. The memory cell of claim 1 further comprising first output terminals including a first node and a second node, and a second memory cell having second output terminals including a third node and one of the first node, the second node, and a fourth node.

17. The memory cell of claim 1 wherein the first diffusion extends into at least a second memory cell.

18. A memory cell comprising:
  a plurality of transistors connected so as to restore a data value to a node of the memory cell to an initial value following an event upsetting the initial value;
  a first well of a first type having a first node target area and a second node target area;
  a second well of the first type having a third node target area and a fourth node target area;
  a third well of the first type;
  a first well of a second type between the first well of the first type and the third well of the first type having a fifth node target area and a sixth node target area; and
  a second well of the second type between the second well of the first type and the third well of the first type having a seventh node target area and an eighth node target area, wherein each of the first and second node target areas are separated from each of the third and fourth node target areas by at least two microns, and each of the fifth and sixth node target areas are separated from each of the seventh and eighth node target areas by at least one micron.

19. The memory cell of claim 18 wherein the memory cell is laid out according to a design technology less than 90 nm.

20. The memory cell of claim 18 wherein the memory cell has an aspect ratio of at least 5:1.

* * * * *